United States Patent [19]

Münster et al.

[11] Patent Number: 5,066,951
[45] Date of Patent: Nov. 19, 1991

[54] CIRCUIT ARRANGEMENT FOR ADJUSTING THE TRIGGERING POINT OF AN INDUCTIVE KEYBOARD

[75] Inventors: Horst Münster, Brigachtal; Hans-Jürgen Wendt, Villingen-Schwenningen, both of Fed. Rep. of Germany

[73] Assignee: Mannesmann Kienzle GmbH, Villingen-Schwenningen, Fed. Rep. of Germany

[21] Appl. No.: 426,893

[22] Filed: Oct. 24, 1989

[30] Foreign Application Priority Data

Oct. 28, 1988 [DE] Fed. Rep. of Germany ....... 3836733

[51] Int. Cl.$^5$ ...................... H03M 11/00; G06F 3/02
[52] U.S. Cl. ........................................ 341/32; 341/24; 341/26; 400/479.2
[58] Field of Search ................ 341/22, 32, 24, 26; 235/145 R; 178/17 C; 400/477, 479, 479.2; 200/260, 261, 250, 251; 335/192, 195, 194

[56] References Cited

U.S. PATENT DOCUMENTS

| | | | |
|---|---|---|---|
| 3,522,442 | 8/1970 | Wood | 341/32 |
| 3,638,221 | 1/1972 | Bernin | 341/32 |
| 3,641,568 | 2/1972 | Brescia et al. | 341/32 |
| 3,668,697 | 6/1972 | Cochran et al. | 341/32 |
| 3,765,014 | 10/1973 | Taylor | 341/32 |
| 3,772,684 | 11/1973 | Scantun | 341/32 |
| 4,117,438 | 9/1978 | Kim et al. | 341/32 |
| 4,300,127 | 11/1981 | Bernin | 341/32 |
| 4,398,180 | 8/1983 | Rometsch et al. | 341/32 |
| 4,494,109 | 1/1985 | Bernin | 341/32 |
| 4,529,967 | 7/1985 | Gizzt | 400/479.2 |

Primary Examiner—Donald J. Yusko
Assistant Examiner—Yuk H. Lau
Attorney, Agent, or Firm—Toren, McGeady & Associates

[57] ABSTRACT

The present invention is directed to a circuit arrangement for adjustment of the triggering point of the keys in an inductive keyboard. The keyboard consists essentially of a printed circuit board designed in a matrix-like manner, comprising coils superimposed upon each other, into which a ferrite pin plunges when a key is actuated. By the cooperation of a pulse generator with a current switch which can be influenced through control lines, said cooperation being controllable by a microcomputer, a current pulse is coupled from one coil to another coil and is recognized as a readout signal by a controllable readout amplifier and is conducted further to a central unit. The adjustment of the triggering point of the keys is accomplished by varying the steepness of the driving current pulse, for example, by means of a blocking time duration in the charging of a capacitor determined only once, which durations are stored in a table of values, or it is derived from the fundamental interlinked signals of the keys.

19 Claims, 13 Drawing Sheets

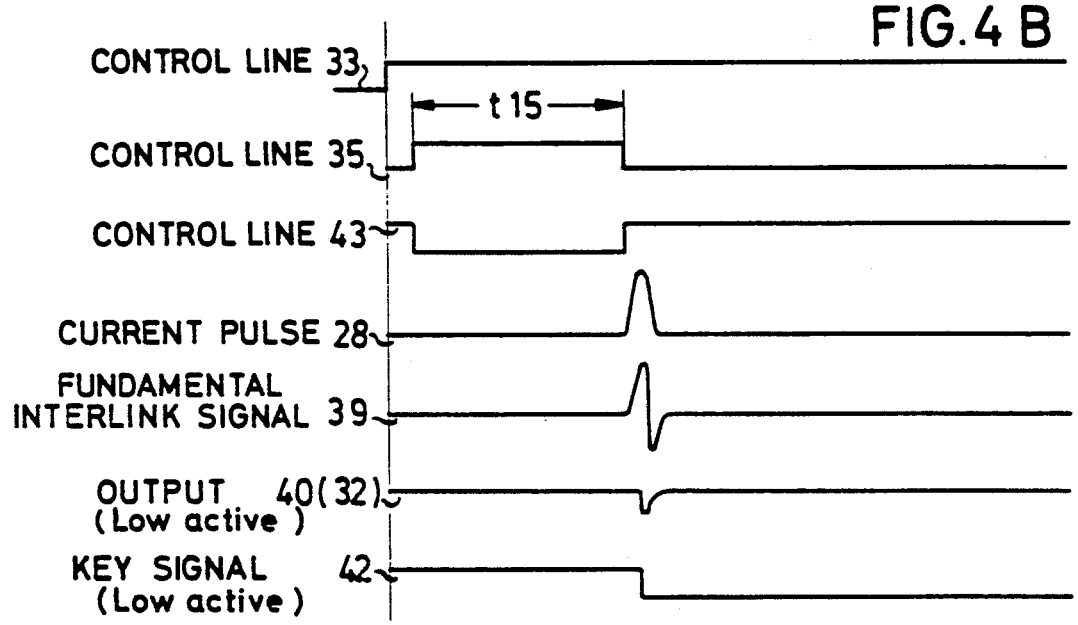
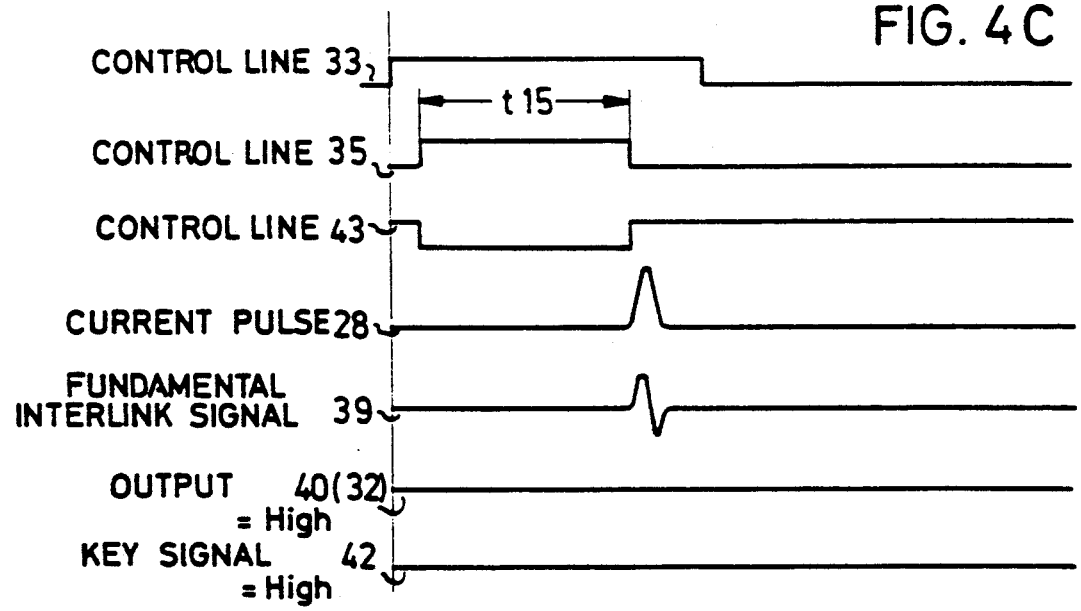

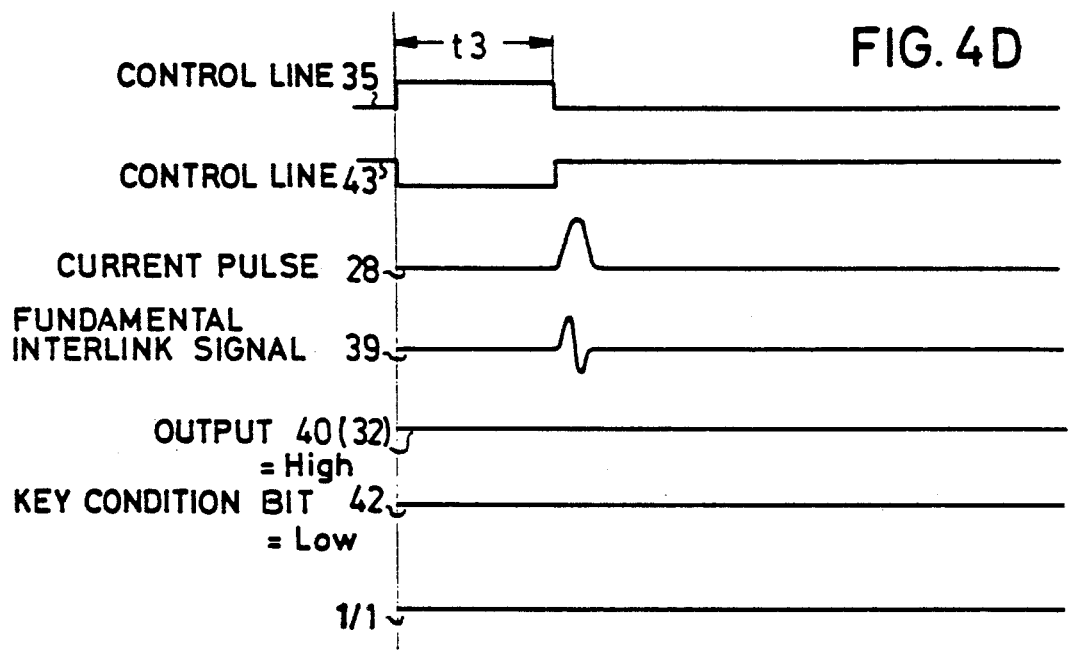
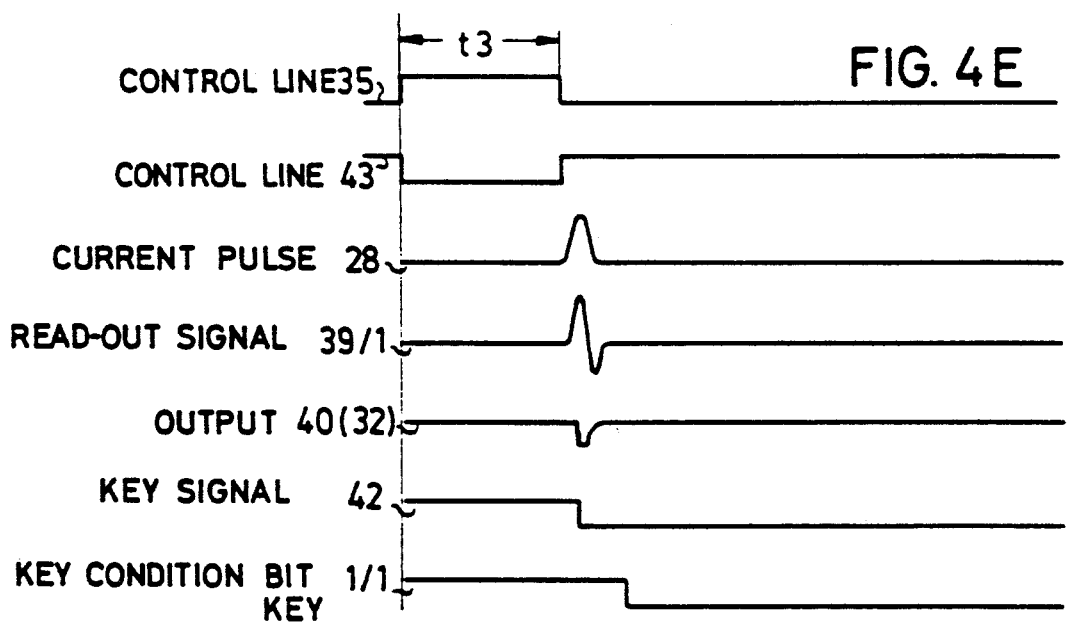

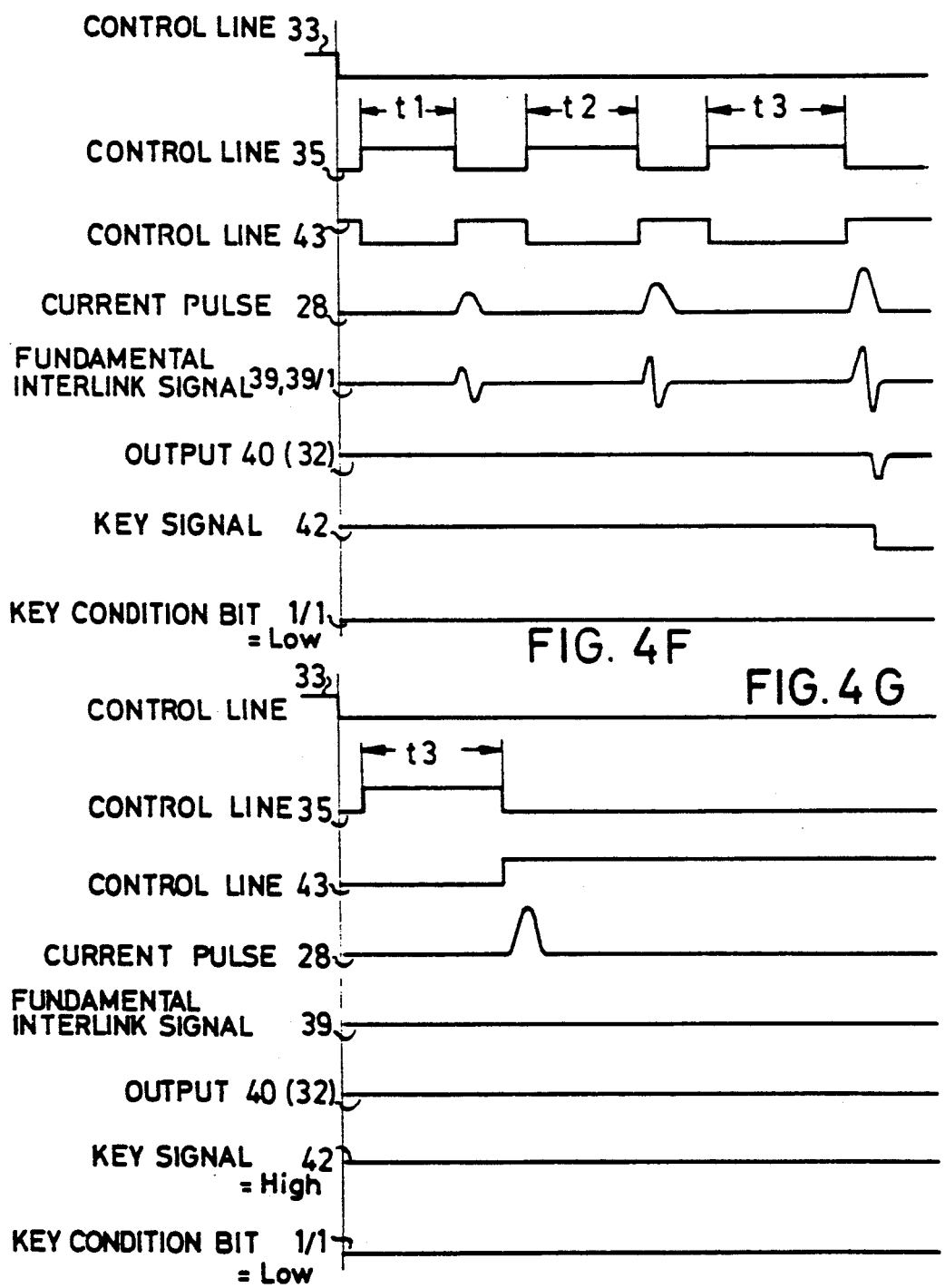

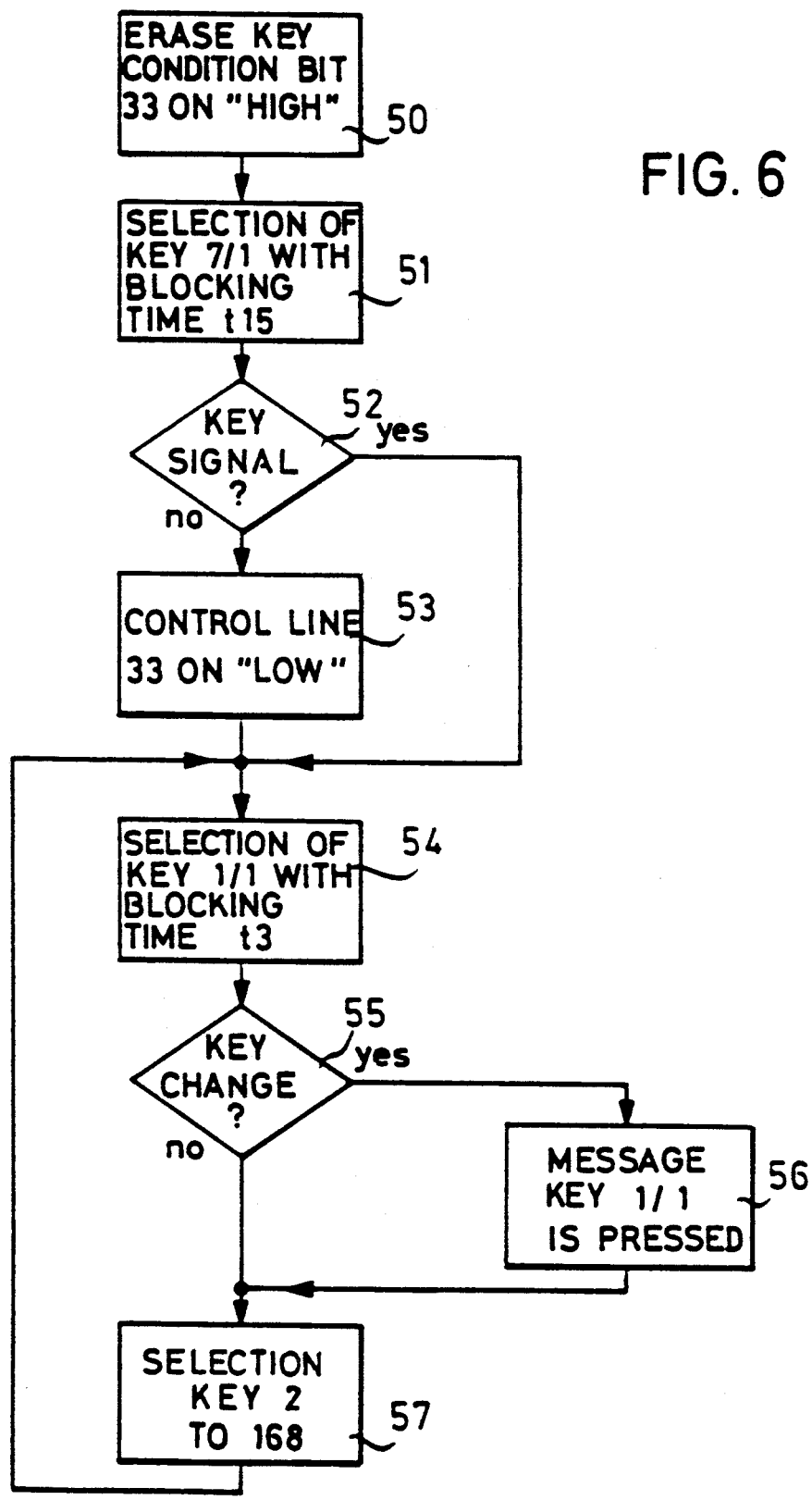

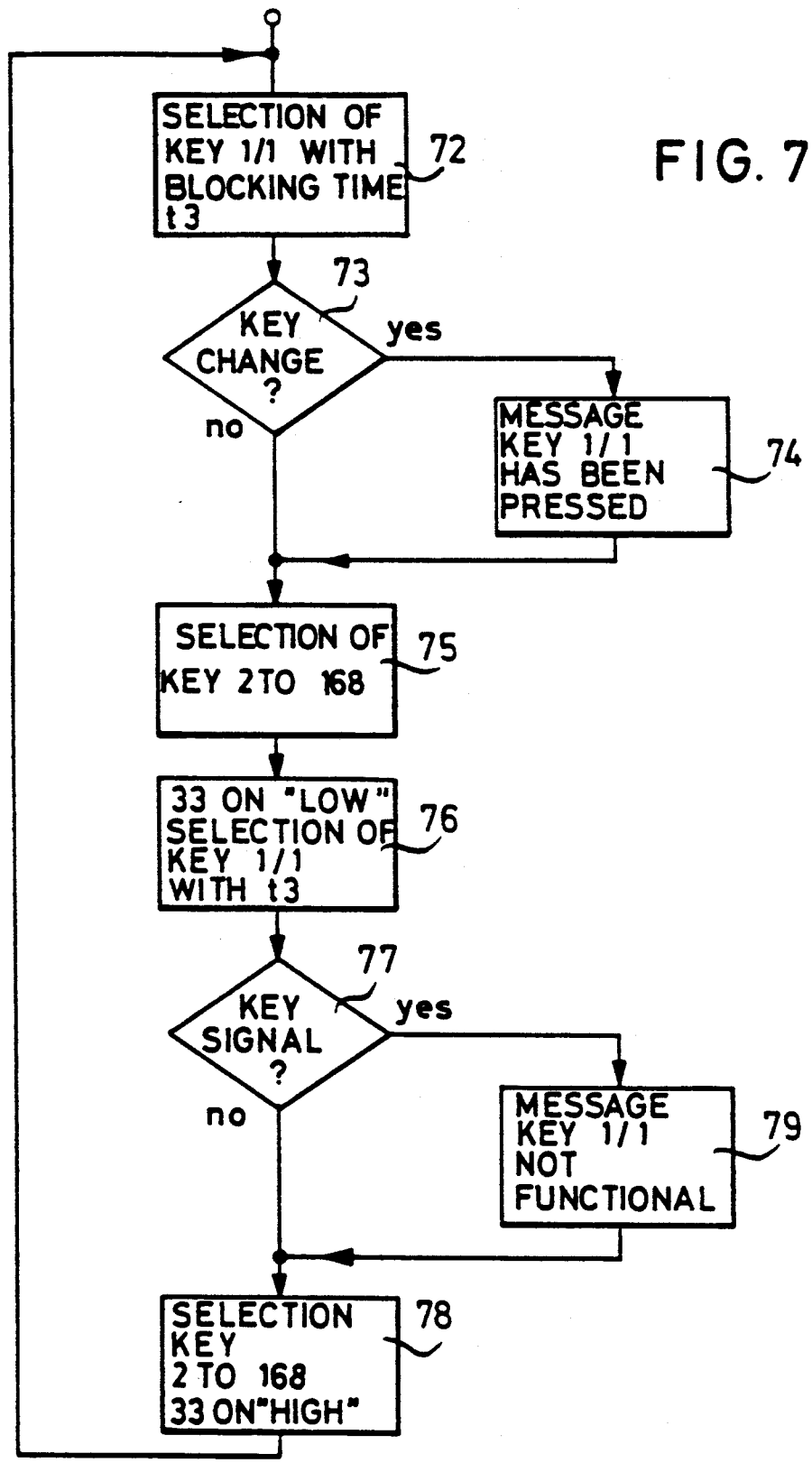

CIRCUIT ARRANGEMENT FOR ADJUSTING THE TRIGGERING POINT OF AN INDUCTIVE KEYBOARD

The invention is directed to a circuit arrangement for adjusting the triggering point of contactless functioning keys in an inductive keyboard designed in a matrix-like manner.

BACKGROUND OF THE INVENTION

Each key in such a keyboard essentially consists of a key button with a magnetic member, typically of ferrite, or pin fastened therein, which when operated plunges or enters into windings arranged on a printed circuit board of the matrix-like structured keyboard and generates a coupling signal. It also includes means for eliminating the effects of inherent mechanical and electrical tolerances upon the adjustment of the triggering point.

Keyboards of the above-mentioned type have been in widespread use as part of a computer terminal. The adjustment of the triggering point or triggering level in this known keyboard is currently done by a two-stage compensation process. An IC-component (SN 7445) is used as a current switch, which requires a supply voltage of 5 volts plus or minus 5%. Because of procurement difficulties expected for the IC SN 7445, and in order to expand the tolerance of the supply voltage, this component has been replaced by seven P-N-P transistors. This, however, entails that the tolerance of the collector-emitter voltage of the current switches increases, and thus the tolerance of the triggering point is also increased. The tolerances are also increased when the number of windings in the coils is diminished, which allows a cost optimized fabrication of the printed circuit boards. These intended measures would, in a known keyboard, require at least a three-stage compensation for each individual row of keys for adjustment of the triggering point.

The tolerances which affect the triggering point or level of an inductive keyboard are caused by a great variety of influences, for instance, by the fabrication tolerances of the ferrite pins inserted into the key buttons, by the separate coupling tolerances of the secondary coils, by the tolerance of the offset voltage of a signal readout amplifier, by the different internal resistances of the individual signal switches in a multiplexer for the matrix, by temperature fluctuations and supply voltage tolerances, and by different current wave slopes of the electronic pulse generator due to different current switch thresholds.

A contactless, inductively functioning circuit arrangement for application in a keyboard arranged in a matrix-like manner s also known from the European patent publication EP 009 420, which provides a differential transformer for generation of the switching function. A differential transformer is assigned to each individual key, which essentially is formed from two pairs of primary-secondary windings, wherein the primary and secondary windings are respectively arranged in one plane and are interconnected. In order to change the mutual inductance, one component is moved from an external position into a position within one pair of primary-secondary windings, while no such component changing the mutual inductance is provided in the second pair of windings. Apart from the disadvantage of requiring a larger area, a compensation of the fundamental interlink signal tolerances is required for each key as well as for changes in the supply voltage

SUMMARY OF INVENTION

It is a principal object of the invention to provide a circuit arrangement for adjustment of the triggering point of an inductive keyboard and for functional monitoring thereof which overcomes the known difficulties and which can eliminate a multistage compensation process.

In accordance with one aspect of the invention, means are provided for supplying a current pulse to drive the key primary winding, and the steepness or rise time of the current pulse is controlled by a microcomputer in order to preset the triggering level for each keyboard key.

In accordance with a feature of the invention, a current switch for the driving current pulse comprises a plurality of transistors, and the driving current pulse steepness is varied by selectively activating one or more of the transistors.

In accordance with a further feature of the invention, a capacitance is provided connected to the current switch The capacitance can be charged to a varying voltage by altering a blocking time period of the current switch. The capacitance serves as the driving current source whose charged voltage determines the steepness of the driving current pulse.

A feature of the invention is blocking each of seven current switches in order to charge a capacitance. When the current switch is turned on, a row of keys is selected and at the same time a current pulse flows through the primary row of coils until the capacitance is discharged. The steepness of the rising edge of the current pulse is controlled by a microcomputer, by changing the duration of the blocking period. Thus the triggering point of a key (or of all the keys) can be adjusted to a specific amount of key travel. This has the advantage that the hitherto necessary two-stage compensation can be eliminated; additionally the printed circuit board does not need to have feed-throughs or through-holes, since now a smaller number of windings is possible for the layout of the primary and secondary coils.

Several refinements of the invention are possible, which are directed to the determination of the value of the duration of the blocking time period. In one embodiment, the value of the duration of the blocking time period is derived, for instance, from a reference signal. The fundamental interlink signal of the keys can serve as the reference signal. In a possible second variant, the value of the blocking time period can be established as a fixed value in a lookup table. Further, the microcomputer can continuously monitor the operability of each key without any additional circuits being required (for instance, by controlling the pulse generator, the current switch and the readout amplifier) and, in case of malfunction, it can trigger a fault announcement, if the value of the blocking time is derived from the fundamental interlink signals.

BRIEF DESCRIPTION OF DRAWINGS

In the following, the invention is described with particularity with the help of drawings depicting two different embodiments for the adjustment of the triggering point, wherein:

FIGS. 4B-4I are condition pulse waveform diagrams for the microcomputer, pulse generator, current switch, multiplexer and readout amplifier;

FIG. 6 is a flow diagram of the method steps according to the circuit arrangement in FIG. 5;

FIG. 7a and 7b are flow diagrams for an adjustment of the triggering point with fundamental interlink signals in accordance with the invention.

DETAILED DESCRIPTION OF PREFERRED EMBODIMENTS

Figure 1A:
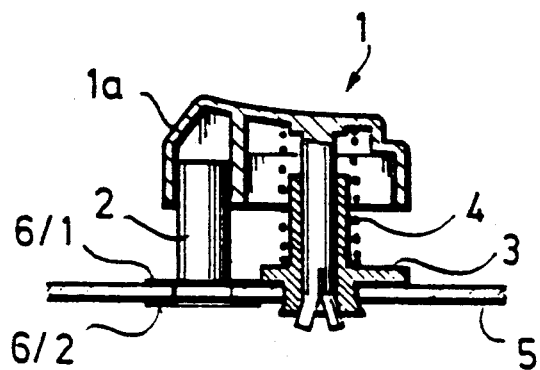
FIG. 1A is a simplified illustration of the arrangement of a key in a printed circuit board in cross-section.
Figure 1B:
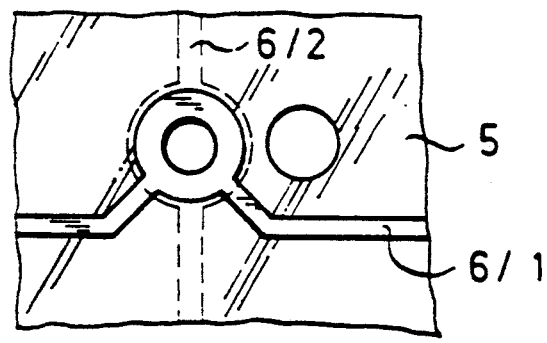
FIG. 1B is a diagrammatic illustration of the arrangement of a primary and secondary coil on a printed circuit board.

The construction of a typical key element such as used in a known keyboard of the previously designated type is first described. Each key element includes a key button required for its actuation, or expressed more simply, of a key 1, into which a magnetic (typically of ferrite) pin 2 has been mounted. The key 1 is guided in a key socket housing or mounting 3 and forms together with it a structural unit. The key socket 3 can be placed in appropriately formed bores in a printed circuit board 5 and is secured in its operating position in the printed circuit board 5 by snap in lugs at the key socket 3. A spring 4 abuts on the one side at the key socket 3 and on the other side at the key 1 and ensures that the key 1 returns to its initial position after each actuation. When the key 1 is actuated, the ferrite pin 2 attached to said key plunges into the primary coil 6/1 and secondary coil 6/2 arranged coaxially or superimposed above each other on the printed circuit board 5 of the keyboard and effects an inductive coupling of the primary coil 6/1 to the secondary coil 6/2. FIG. 1B shows the layout of the primary and secondary coil windings 6/1 and 6/2.

Figure 5:
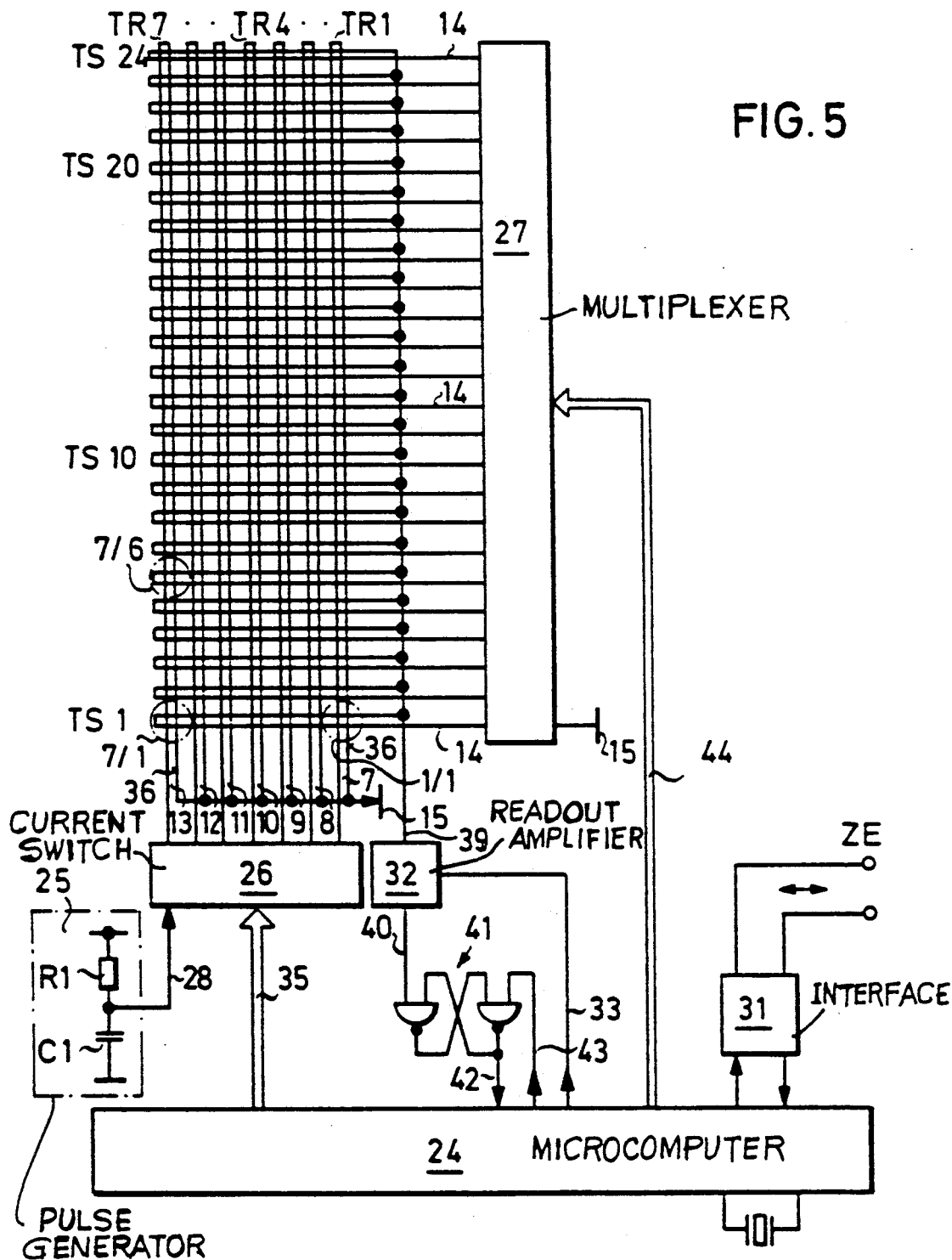
FIG. 5 is a schematic circuit diagram of an inductive keyboard of the invention.

The keyboard in the embodiment example of FIG. 5 consists of a matrix-like arrangement of a total of 168 keys, which are placed upon the printed circuit board 5 at the points of intersection of seven line-like arranged rows of keys TR1-with columns of keys TS1-TS24 extending perpendicularly thereto. The primary coils 6/1 are located in line loops 7-13 and are arranged on the topside of the printed circuit board 5 (FIGS. 1A and 1B), while the secondary coils 6/2 are correspondingly provided on the bottom side of the printed circuit board 5 and are included in similar line loops 14 corresponding to the TS1-TS24. A diagrammatic illustration of an arrangement of the primary coils 6/1 and secondary coils 6/2 in a matrix is shown in FIG. 5, wherein the crossing points of the line loops 7-13 with the line loops 14 corresponding to the key columns TS1-TS24 symbolize respectively the arrangement of a primary coil 6/1 to a secondary coil 6/2.

The line loops 7-13 for the primary coil 6/1 proceeding from the appropriate current switch 26 are conducted back to ground 15 over the range of the key columns TS1-TS24. In this embodiment, there are 7 current switches, one for each key row. The line loops 14 with the secondary coils 6/2 in the key columns TS1 to TS24 proceeding from a multiplexer 27 are connected to a readout amplifier 32 (see FIG. 5) while overlapping the line loops TR1-TR7 for the primary coils 6/1. If a key 1 in FIG. 1 is pressed, the ferrite pin 2 plunges into the printed circuit board 5 and causes a coupling of the primary coil 6/1 assigned to this key with the corresponding secondary coil 6/2, when a driving current pulse flows through the primary coil 6/1 and when the secondary coil 6/2 of the key 1/1 (in the example key 1/1 in a row of keys TR1 and in a column of keys TS1) has been selected by the multiplexer 27.

Figure 2:
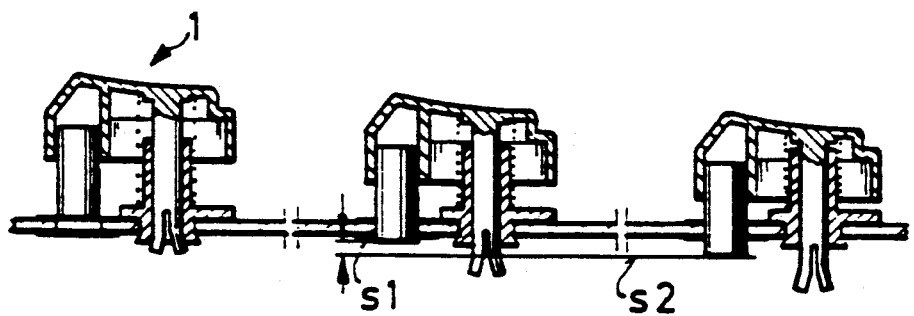
FIG. 2 is a diagram of several keys in three operating positions, including neutral position, and with a minimum and maximum key travel for attaining the triggering point.

According to the operational principle of an inductive keyboard, a fundamental interlink signal 39 is coupled or generated by a current pulse 28 from a primary coil 6/1 into the secondary coil 6/2 (FIG. 4F) in case any key has been selected, but not pressed down. This fundamental interlink signal 39 is increased when a key is selected and simultaneously pressed by the readout signal 39/1 proper which is generated by the more effective coupling of the primary coil 6/1 and the secondary coil 6/2. A key which has not been selected or a key with a malfunction does not supply any fundamental interlink signal 39. A key with a smaller fundamental interlink signal 39 must traverse a greater key travel s (FIG. 2) up to the triggering point, if the steepness of the current pulse 28 has not been changed. This circumstance permits one to recognize the tolerance of the triggering point already in the non-depressed condition of a key (neutral position). FIG. 2 shows at the left the key neutral position; at the center a partly depressed key to a level s1; and at the right a further depressed key to a deeper level s2, where s represents s2-s1.

The individual addresses of the keys are successively selected and thereupon interrogated or polled by means of the cooperation (FIG. 5) between a microcomputer 24, a pulse generator 25, a current switch 26, a multiplexer 27, and a readout amplifier 32; interrogation is meant to ascertain whether a pressed key is present or not. This means that only if a key 1 has been pressed will a current pulse 28 of the pulse generator 25 be transmitted from the primary coil 6/1 to the secondary coil 6/2 and be amplified by the readout amplifier 32; thereupon it is temporarily stored through a line 40 into a flip-flop 41 prior to being stored by the microcomputer 24 and the lines 42, 43 in the key memory as a key condition bit in the storage position assigned to this address.

We have already pointed out in the above introduction the reasons for the tolerances involving the position of the triggering points. In particular, the tolerance of the triggering point of each key can, for instance, be corrected by a change of the ferrite pin position in the key 1, or by a change of the number of windings of the primary coil 6/1 and the secondary coil 6/2, or by a change of the steepness of the current pulse 28. If the triggering point is to be adjusted automatically under program control, then only the adjustment by a change of the steepness of the current pulse 28 of a pulse generator 25, 25/1 or 25/2 is appropriate, which pulse generator can be designed in accordance with the circuit in FIG. 3E, 3C or 3A.

Figure 3A:
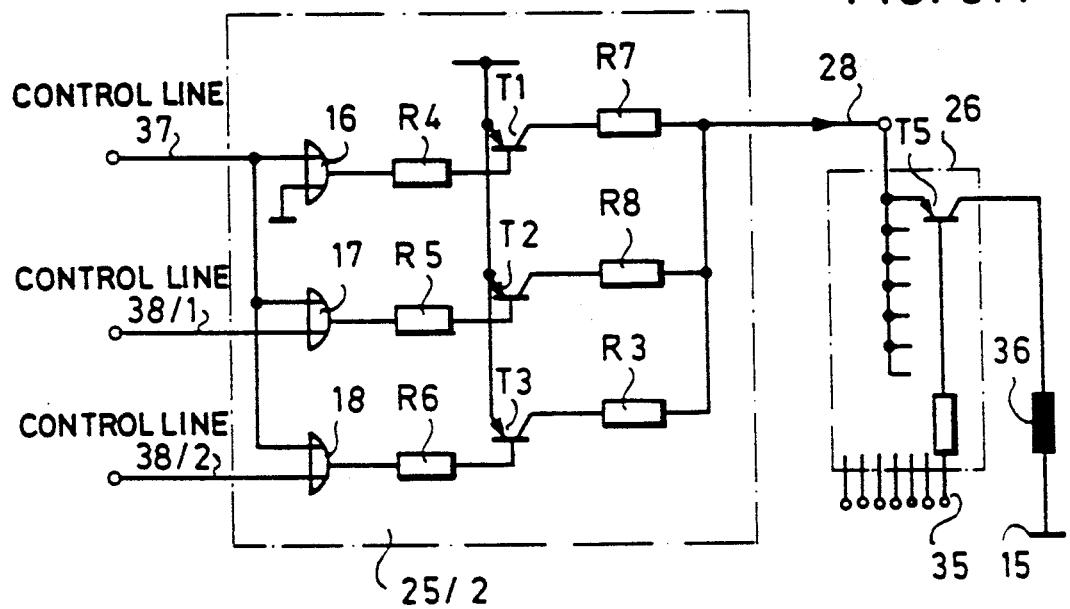
FIG. 3A is a schematic circuit diagram of a pulse generator for stepped change of the steepness of the current pulse edges in accordance with the invention.
Figure 3B:
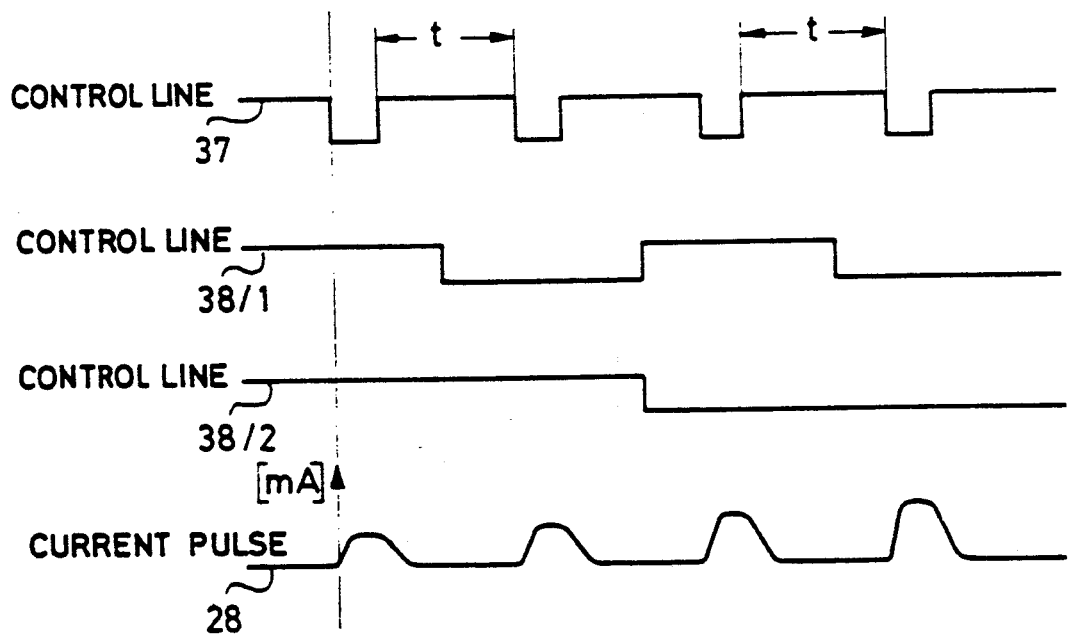
FIG. 3B is a waveform diagram for the circuit of FIG. 3A.

A change of the steepness of the driver current pulse edge by a pulse generator 25/2 according to the circuit in FIG. 3A occurs in four stages and is controlled by the microcomputer 24 through a control line 37 and two additional control lines 38/1 and 38/2. The three control lines 37, 38/1, 38/2 are conducted respectively through an OR gate 16, 17, 18 and a resistance R4, R5 and R6 to the base of PNP transistors T1, T2, T3, whose emitter is connected through resistances R7, R8, R3 through a common current pulse line 28 with the current switches 26. If a low voltage level is applied to the emitter side of the transistors T1–T3, these become conductive. Adding the transistors T2 and T3 to the circuit, the steepness of the rising edge of the current pulse 28 can be increased in this way. A diagrammatic pulse diagram is shown in FIG. 3B, which symbolizes the stagewise increase of the steepness of the rising edge of the current pulse 28 because of the switching in of the transistors T2 and T3 through the control lines 38/1 and 38/2. The pulse on line 37 enables all 3 gates, turning T1 ON. T2 is turned ON when a pulse appears on line 38/1 and T3 when a pulse appears on line 38/2.

Figure 3C:
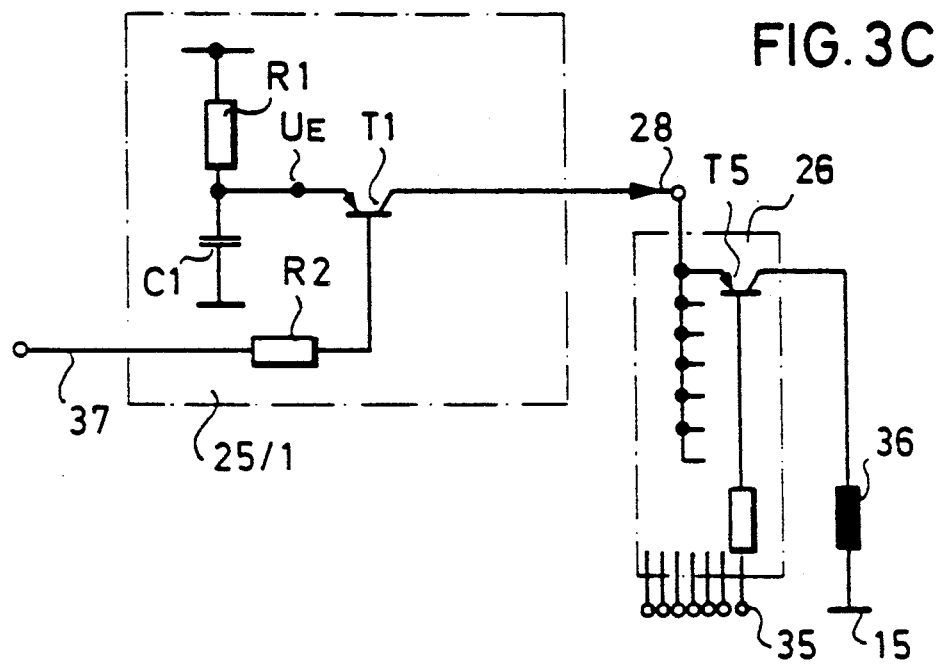
FIG. 3C is a circuit of a pulse generator for a stepless change of the steepness of the current pulse edges in accordance with the invention.
Figure 3D:
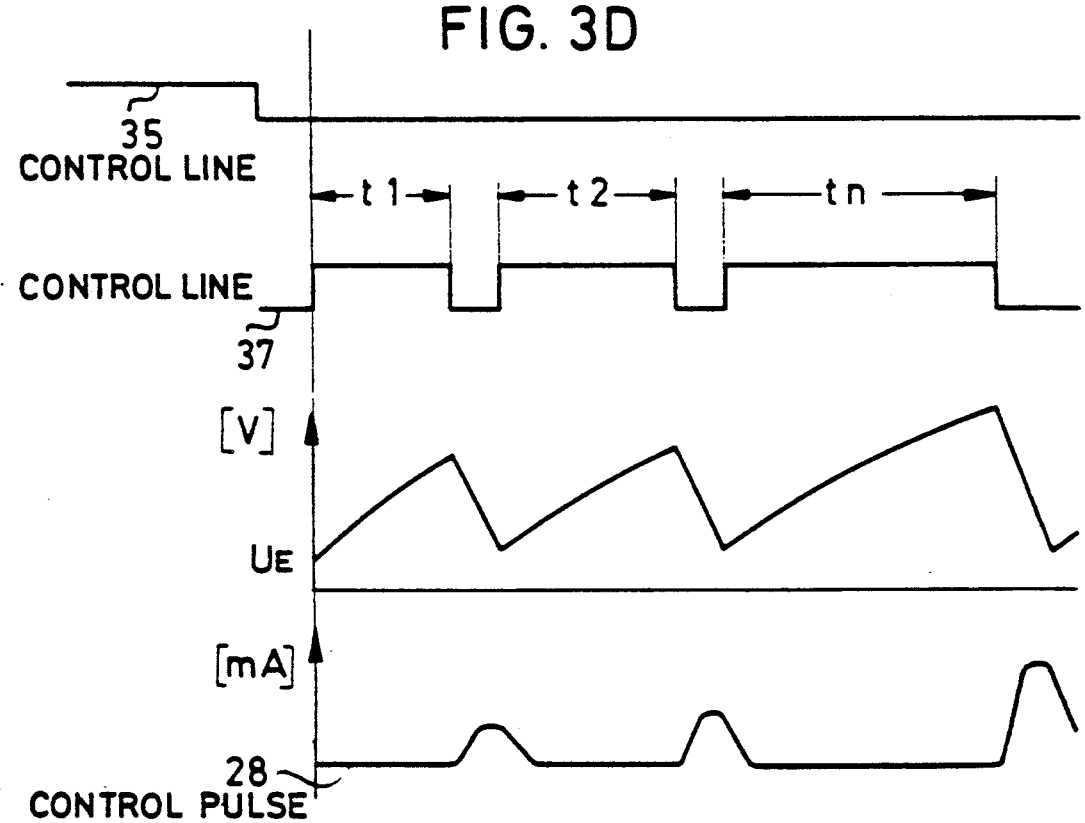
FIG. 3D is a waveform diagram for the circuit of FIG. 3C.

Another embodiment for changing the steepness of the rising edge of the current pulse 28 is indicated in FIG. 3C. A pulse generator 25/1 appearing in the circuit shown there causes in contrast with the previous example (in FIG. 3A) a stepless change of the steepness of the rising edge of the current pulse 28. The pulse generator 25/1 in FIG. 3C has now only one control line 37, which is connected through a resistance R2 to the base of the signal transistor T1. The emitter voltage $U_E$ is determined by a capacitance C1 connected in series with the resistance R1. Finally a collector line is connected with the current switches 26 for transmittal of the current pulse 28. If the control line 37 of the pulse generator 25/1 has assumed a high level, T1 is OFF and the capacitance C1 is charged through the resistance R1 according to an e-function until the control line 37 assumes a low level (FIG. 3D) and the capacitance C1 can thereupon discharge itself through the transistor T1 and the transistor T5 of the current switch 26 and the primary coils 36 (or 6/1). The steepness of the current pulse 28 is determined by the magnitude of the voltage at the emitter of T1 and is controlled by the microcomputer 24 through the control lines 37 by changing the duration of the blocking time period tl-tn, that is, the time during which T1 remains OFF allowing the capacitor C1 to continue charging.

Figure 3E:
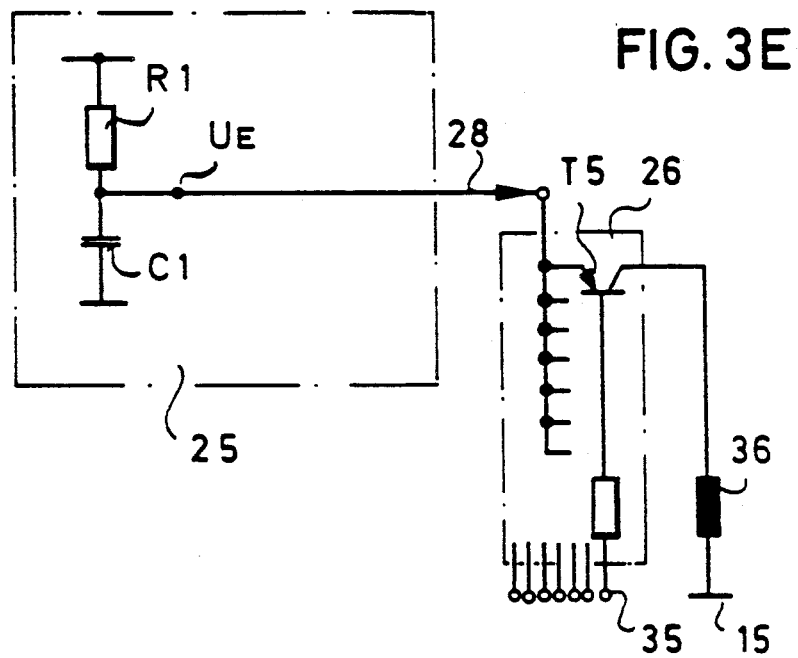
FIG. 3E is a circuit of a pulse generator without a control line for stepless control of the steepness of the current pulse edges in accordance with the invention.
Figure 3F:
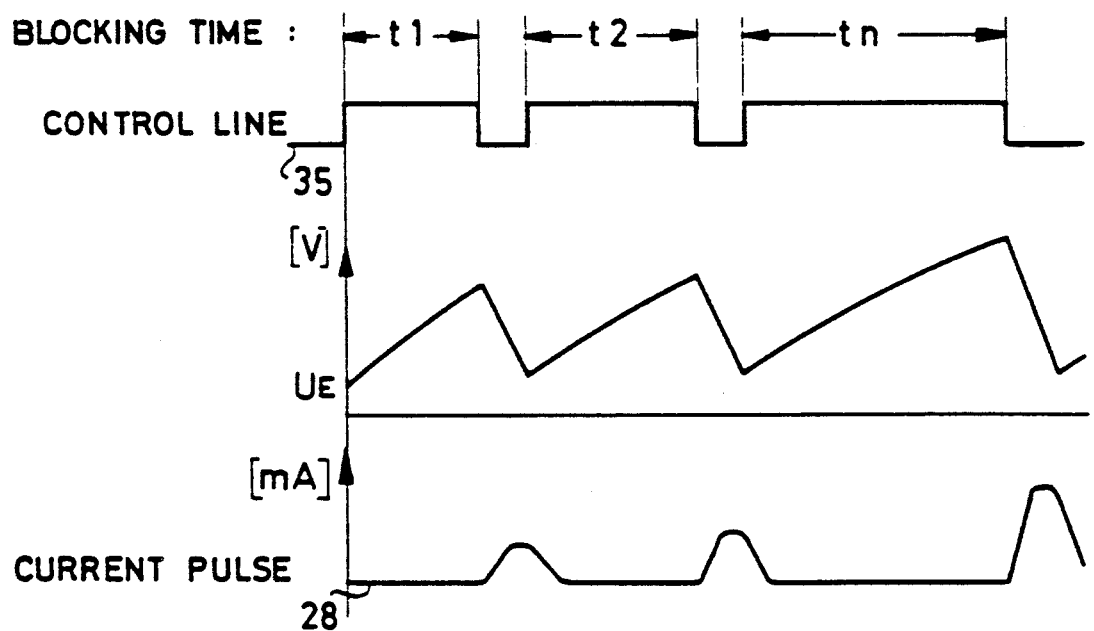
FIG. 3F is a waveform diagram for the circuit of FIG. 3E.

In another preferred embodiment of a pulse generator 25 in FIG. 3E and FIG. 6 (described later), the control line 37 as well as the transistor T1 and the resistance R2 required up till now are eliminated, compared to the previously explained pulse generator 25/1, which even if only the expenditure in components is considered, bring with it a considerable simplification and cost saving. The pulse generator 25 consists now merely of the capacitance C1 connected in series with the resistance R1, in between which an emitter voltage $U_E$ is tapped and is applied to the seven current switches 26. The functional mode of this pulse generator 25 in FIGS. 3E–3F is as follows. To begin with, the seven current switches 26, actually the transistors T5, are blocked by a high level on the seven control lines 35, in order to charge the capacitor C1 through the resistance R1. By switching ON a current switch 26 with a low level on a control line 35, the blocking time period tl-tn is terminated, and there simultaneously flows a current pulse 28 through the appropriately actuated transistor T5 of the current switch 26 through the primary coils 6/1 of the key primary row coils 36 until the capacitance C1 is discharged (FIG. 3E).

The steepness of the current pulse 28 (see FIG. 3F) is controlled by the microcomputer 24, by its being able to change the blocking time period tl-tn for each individual key. If the blocking time t1 is changed, for instance if it is lengthened to a blocking time t2, then the rising edge of the current pulse 28 becomes steeper, since the capacitor C1is charged to a higher voltage value $U_E$. Due to this, the pulse height or voltage amplitude of the pulse of the fundamental interlink 39 and the readout signal 39/1 increases and the travel of the key magnet s up to the triggering point of the appropriate key is reduced.

A blocking time period value tl-tn has been stored for each individual key, which appears in a look-up table of values or, alternatively, is stored as a changeable magnitude in a print-readout memory.

Figure 4A:
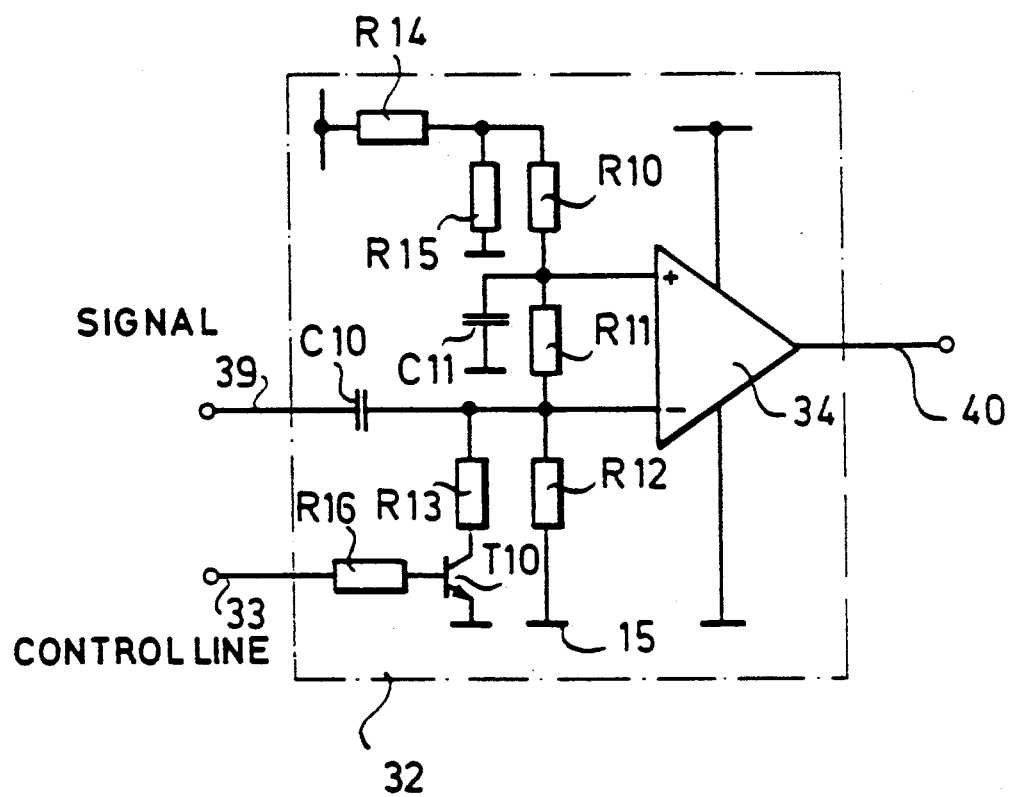
FIG. 4A is a schematic circuit diagram of a readout amplifier.

The readout amplifier 32 appears in FIG. 4A, to which the fundamental interlink signal 39 or the readout signal 39/I from the output side of the secondary coils 6/2 (column coils) (FIG. 5) is inputted. A signal on the output line 40 of a voltage amplifier 34 of the readout amplifier 32 is stored in a flip-flop 41 and can be outputted through a line 42 under the control of the microcomputer 24 through a line 42. The sensitivity of the readout amplifier 32 can be controlled through a control line 33. This supplied key signal 39, 39/1 is decoupled by a capacitance C10 in the readout amplifier 32 and applied to the minus input of the amplifier 34. A negative bias voltage is applied to the plus input of the amplifier 34 through a voltage divider consisting of resistances R14 and R15 and through resistances R10, R11 and R12. The plus input of the amplifier 34 is connected through a capacitance C11 to ground. Control of the sensitivity is accomplished through a control line 33, which is conducted through a resistance R16 to the base of a transistor T10. A resistance R13 is placed in the collector-emitter circuit in series with the resistance R11 and in parallel to the resistance R12. Transistor T10 is switched on by a high level and this increases the current flowing through the resistance R11 by the magnitude of the current flowing through R13. Due to this, the voltage decay at the resistance R11 is increased, and thus the negative bias voltage at the plus/minus input of the amplifier 34 becomes higher and the sensitivity of the readout amplifier 32 is reduced.

Beyond the fundamental interlink signal 39, the readout signal 39/1 increases with increasing key travel s (between s1 and s2, FIG. 2) and is decoupled as a dc current through the capacitance C10 (FIG. 4A) and supplied to the readout amplifier 32. When the positive readout signal 39/1 has overcome the negative bias voltage at the ± input of the readout amplifier 32, its output switches the output line 40 to a low level. The flip-flop 41 stores the key condition (pressed/not pressed) until the appropriate key signal can be interrogated or extracted on line 42 by the microcomputer 24 (FIG. 5).

The fundamental interlink signal 39 has approximately half the signal magnitude of the readout signal 39/1. In order to determine the triggering point tolerances in the neutral position of the keys, the sensitivity of the readout amplifier 32 must therefore (adjustment by the fundamental interlink signals) be reduced from 2 mm to 0 mm key travel.

A compensation of the triggering point is achieved by the voltage divider R14, R15 if the supply voltage changes during the key interrogation. If a supply voltage increase occurs, the sensitivity of the readout amplifier 32 is reduced in the same ratio as the current pulse 28 increases in the steepness of the rising edges through the transistor threshold of the transistor T5 (FIG. 3E).

Figure 7A:
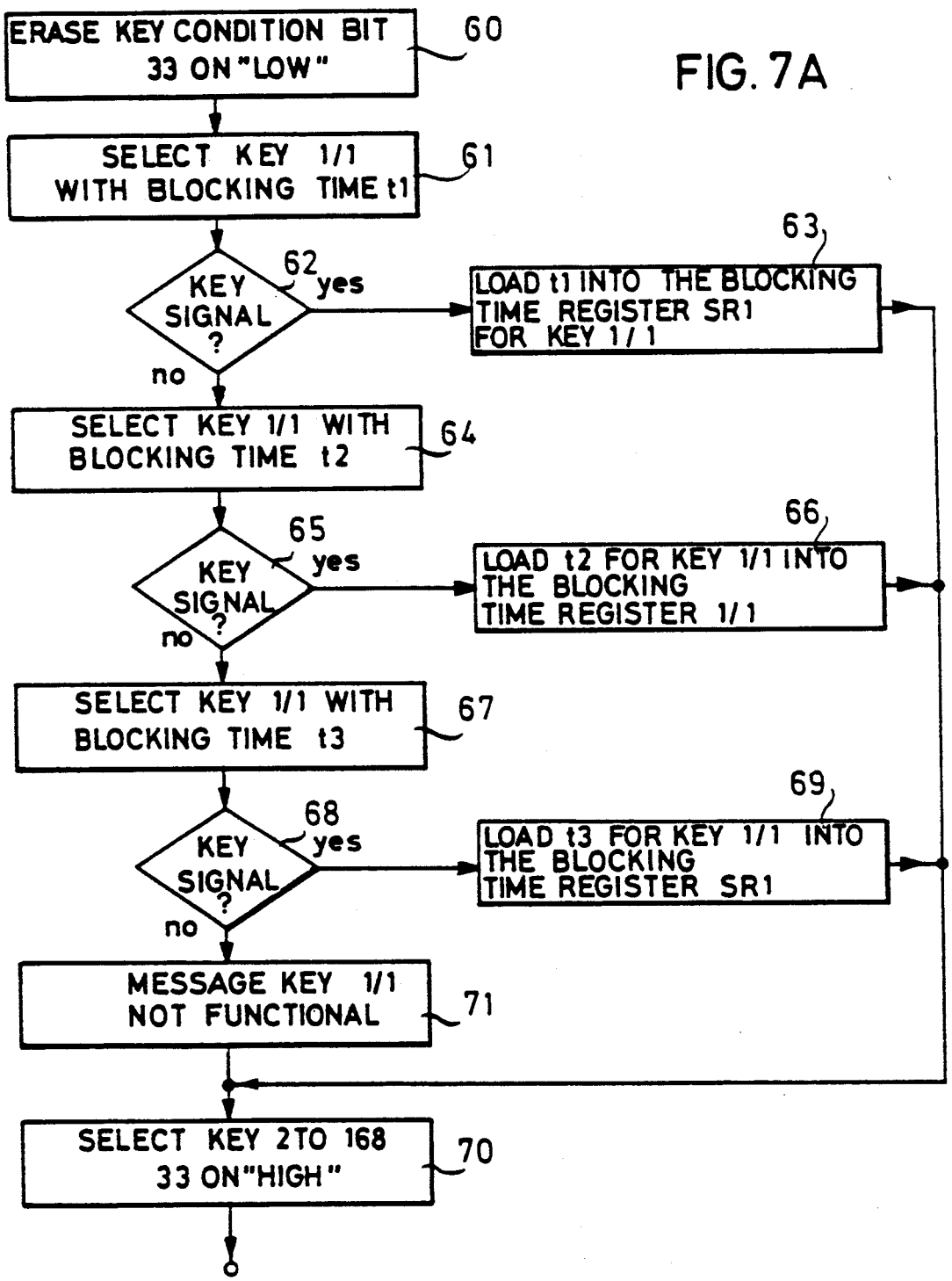

When adjusting the triggering point through a fixed value in the blocking time period duration tl-tn in a look-up table of values, one proceeds as follows: An unchangeable value of tl-tn is assigned to each key. The blocking time duration can correspondingly be changed in n-steps. The corresponding values are measured only once for each new keyboard-printed circuit board (5)-layout. For each key 1 the steepness of the current pulse 28 is increased by lengthening the blocking time of the appropriately assigned current switches 26 (or transistors T5) until the key 1 triggers after having traversed half of the key travel. The blocking time t determined thereby is stored in a register or table as a "program mask". Thus, a blocking time determination as indicated in FIG. 7A is eliminated. Therefore, it is also not necessary for each key to be in the neutral position after the supply voltage has been switched on (with the exception of the key 7/1 indicated in the example in FIG. 5).

In order also to compensate component tolerances, such as for instance an offset voltage of the readout amplifier 32, the microcomputer 24 selects the key 7/1 (this is the key in key row 7 and key column 1), after the supply voltage has been switched on and the key condition bit initialized (see in this connection FIG. 4B, 4C, and the flow chart on FIG. 6, blocks 50, 51). The functional sequence for this is explained in detail below with the help of the embodiments in FIG. 6. In FIGS. 4B-4I, the labels at the left indicate the particular waveform being plotted, using the same reference numerals as before.

If no key signal is present on line 42 in the neutral position of the key 7/1 (block 52), the sensitivity of the readout amplifier 32 is increased by switching the control line 33 to the condition "low" according to FIG. 4C and FIG. 6, block 53.

Under the control of the microcomputer 24, to begin with, in block 50, the key condition bits of key 1 through 168 are erased (key in neutral position "low") and the readout amplifier 32 (FIGS. 4A, 4B, 4C, 5) is switched with the control line 33 ("high"-level) to sensitive, by increasing the negative bias at the ± input by an additional current through the resistance R13 by switching the transistor T10 (FIG. 4A) into the circuit.

Subsequently, block 51 is called up. The key 7/1 (in the key row TR7 and key column TS1) is selected, by the multiplexer 27 switching the secondary coils 6/2 in the key column TS1 to ground through the control lines 44 (FIG. 5), so that the readout signal 39/1 for the key column TS1 can become effective.

In order to trigger a current pulse 28 in the row of keys TR7 through the primary coils 6/1, the capacitance C1 of the pulse generator 25 which at this point in time must be in a completely discharged state, must first be charged through the resistance R1. In accordance with FIGS. 4B, 4C, this occurs by blocking each of the seven current switches 26 over the blocking time period t15. Simultaneously the flip-flop 41 (FIG. 5) is erased by the control line 43 (the key signal in line 42 goes to "high").

The current pulse 28 is triggered at the end of the blocking time period t15 by switching on the current switch 26 of the key row TR7. Now the capacitance C1can discharge through the appropriate current switch 26 for the key row TR7 and through all the primary row coils 6/1 in TR7 corresponding to position 36 (FIG. 3E) (see also FIGS. 4B, 4C).

The program sequence is continued according to block 52 in FIG. 6 with the interrogation of the key signal in line 42. A key signal is recognized when the signal intensity or height (amplitude) of the fundamental interlink signal 39 of the key concerned is greater than the negative bias voltage at the ± input of the readout amplifier 32. This entails that the readout amplifier 32 generates a short, "low"-pulse at the output 40, which is temporarily stored in the flip-flop 41 and which brings the key signal in the line 42 to a "low"-level until the microcomputer 24 can interrogate the key signal line 42.

If the condition "key signal has been recognized" is fulfilled by the key 7/1, the block 53 is not called up (FIG. 4B), because the control line 33 is not changed; therefore the direct call up of block 54 ensues.

A change in line 33 from "high" to "low" as shown in block 53 causes here a key triggering which is earlier by 0.3 mm for each key and is determined by the magnitude of the resistance R13. Component tolerances, as for instance the offset voltage of the readout amplifier 32 are compensated by the sensitivity of the readout amplifier controllable by the microcomputer 24. The negative bias voltage at the ± input of the readout amplifier 32 can be diminished by the change in the control line 33, because due to the blockage of the transistor T10, the current through the resistance R11 is reduced by the value of the current which has additionally flowed through the resistance R13.

The adjustment of the readout amplifier 32 is performed only once because a repetition of the adjustment during the key interrogation in the pressed condition of the key 7/1 would lead to an erroneous adjustment of the readout amplifier 32.

The key interrogation in block 54 starts with the selection the key 1/1. To begin with, the secondary coils 6/2 for the key column TS1 are selected the same as in block 51. Subsequently, each current switch 26 is blocked with a blocking time period value t3, which is stored via a register in a table of values in the microcomputer 24. This value t3 fixed for the key 1/1 reduces the key triggering tolerance of the key 1/1 the better, the more of the n-steps from tl-tn that can be selected by the microcomputer 24. The triggering of the current pulse 28 occurs by the termination of the blocking time t3.

An interrogation in block 55 ensues with respect to the condition "key change of key 1/1 has been recognized". FIG. 4D shows the waveforms of the functional sequence of the key 1/1 if no key change is seen because it is in the neutral position and, therefore, the block 57 is directly selected. In FIG. 4E, the pressed key 1/1 is selected and therein a key change of the key 1/1 is determined. In this case, block 56 is executed.

A key change is determined by an exclusive-OR interlinking of key condition bit and key signal in line 42. The statement "Yes" is issued only if the key condition bit is in the condition "low" and a key signal in line 42 is recognized (FIG. 4E), or if the key condition bit is in the condition "high" and no key signal is recognized in line 42.

Finally, there ensues a message in block 56 "key 1/1 has been pressed", meaning that this condition of the key 1/1 is transmitted (FIG. 5) by a code through an interface 31 to a central unit ZE. In addition, the key condition bit of the key 1/1 is set to the condition "high". If the key 1/1 has been pressed at the next selection, then the key condition bit of key 1/1 is set to "high" and simultaneously a key signal is recognized and thus no key change can be seen in block 55.

Block 57 is called up after block 56 by selecting in sequence the keys 2 through 168 and by appropriately evaluating them. After termination of the block 57, one key cycle has been ended, and then again the selection of block 54 ensues.

The heretofore explained automatic adjustment of the triggering point by the controlled steepness of the current pulse 28 with the help of the once-determined table of values of the blocking period duration of tl-tn has been found to be the type of adjustment best suited for practical applications. As a solution, it is performable on the basis of a stepless change or of an automatic change of the steepness of the current pulse 28 from an appropriately constructed pulse generator 25 or 25/1 which change is controlled by the microcomputer.

Another possibility of adjusting the triggering point is based upon an arrangement wherein the value of the blocking time duration is derived from the fundamental interlink signals of the keys. The sequence of the adjustment of the triggering point by means of fundamental interlink signals is shown in the flow diagram appearing in FIGS. 7A and 7B. It is assumed that each key is in the neutral position during the determination of the blocking time duration.

After the supply voltage of the keyboard has been switched on, the block 60 (FIG. 7A) is called. Herein, to begin with, the key condition bit in the print/readout memory of the microcomputer 24 is erased and the readout amplifier 32 (see FIG. 4A, 4F and 5) is set to sensitive with a "low" level on the control line 33. The change from "high" to "low" causes here a key triggering 2 mm sooner. Thereby, the key triggering point is shifted from 2 mm to 0 mm (=neutral position), so that each functional key supplies a key signal, since the intensity of the fundamental interlink signal 39 is sufficient to switch the readout amplifier 32 to a "low" pulse at the output 40.

Block 61 is called after block 60 by selecting the key 1/1 with the blocking time tl (FIG. 4F). The current pulse 28 is triggered through the termination of the blocking time period tl. The capacitance C1 can now be discharged through the primary coils 6/1 in the key row TR1.

The program sequence is continued by calling up block 62, by interrogation of the key signal 42. No key signal can be seen according to FIG. 4F for the key 1/1, and thus the call up of block 64 ensues. If, on the contrary, the condition "key signal recognized" is satisfied, block 63 is called up. In block 63, the value "1" is stored for the key 1/1 into a blocking time-register SR1. Thereupon the call up of block 70 ensues. If no key signal was recognized for the key 1/1 during the blocking time tl in accordance with block 62, then the blocking time is increased to the value t2 when key 1/1 is next selected according to block 64, the aim being to steepen the rising edge of the current pulse 28. The key 1/1 is therefore again selected, because no key signal was thus far recognized in line 42 for this key.

In the following block 65, there occurs again the interrogation about a key signal on line 42 of the key 1/1. The condition is not satisfied also for the blocking time t2 (see FIG. 4F), and therefore the block 67 is called up. The same applies analogously to the block 66 as to the block 63, with the difference being that if a signal was recognized for the key 1/1, in this case the value "2" is entered into the blocking time register SR1. The blocking time t2 is now increased to the value t3 in the block 67 (consult in this regard FIG. 4F) and the key 1/1 is again selected, since up till now no key signal had yet appeared in line 42. Block 68 follows block 67 with a renewed interrogation of the key signal in line 42. Now, the condition "key signal recognized" is satisfied according to FIG. 4F, as now the again increased fundamental interlink signal 39 of the key 1/1 can switch the output 40 of the readout amplifier 32 to a "low" pulse. If, however, there is an operational malfunction in key 1/1, then following upon block 68, block 71 is called up.

Since a key signal was recognized in block 68 for the key 1/1, in block 69 the value "3" is stored in the blocking time-register SR1. In order to reduce the triggering tolerance of the key 1/1, the maximum blocking time t3 was required. The subsequent selection of the key 1/1 occurs always with the blocking time value t3 stored in the blocking time-register SR1.

Following upon block 69 or 71, block 70 is called up. After the blocking time value for the key 1/1 has been determined, the values of the blocking times of the keys 2 through 168 are determined and correspondingly stored in the blocking time register SR2 through SR168 (see FIGS. 4H, 4I). Subsequently, the sensitivity of the readout amplifier 32 is reduced by a "high" level through the control line 33, so that a key signal can only be recognized in the pressed down state of the keys.

The following should be observed as a supplement concerning block 71: If a malfunction occurs with key 1/1, then no key signal can be observed on line 42. Then a malfunction message is sent by the keyboard to the central unit ZE reading "key 1/1 unable to function".

By way of continuation of the flow diagram in FIG. 7B, there ensues the selection of the keys with the previously stored values in the blocking time register SR1 through SR168. The functional sequence of the key selection of the key 1/1 is shown in FIG. 4D, if key 1/1 is in the neutral position or in FIG. 4E, if the key 1/1 has been pressed.

Figures 4H, 4I:
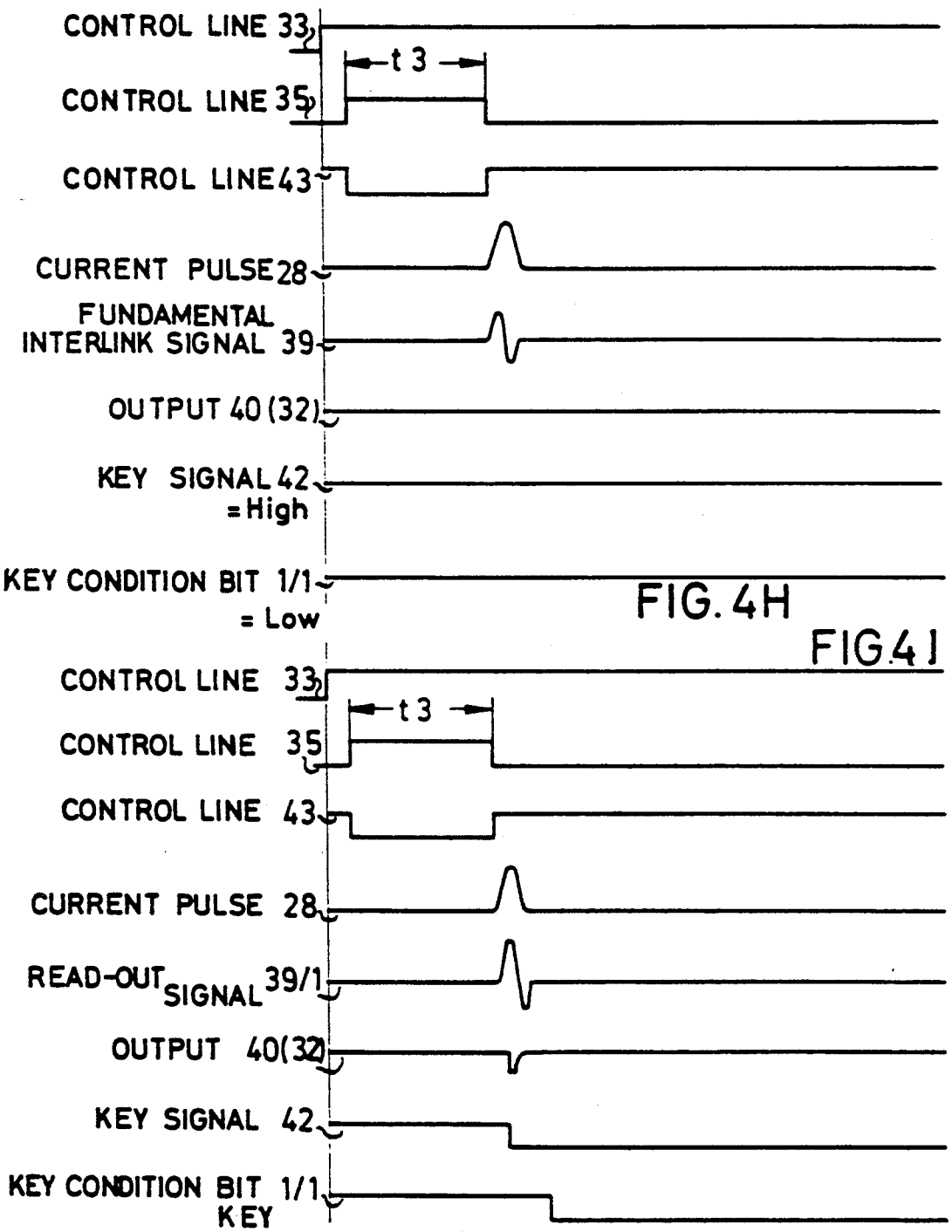

Block 72 is called up after block 70. The selection of the key 1/1 is done with the blocking time value t3 from the blocking time register SRI (see FIGS. 4H, 4I). After block 72 there ensues in block 73 an interrogation as to the condition "key change of key 1/1 has been recognized". If now key 1/1 is in neutral position, block 75 is called up (FIG. 4H). If, on the contrary, the condition "key change recognized" is satisfied, then the sequence proceeds according to FIG. 4I, and block 74 is called up.

The functional sequence steps of block 74 are the same as they were already depicted and explained in connection with block 56.

Proceeding from block 74 or from block 73, block 75 is now called. In this portion of the flow diagram, the keys 2 through 168 are selected and evaluated (see FIGS. 4H, 4I).

Block 76 follows upon block 75. Here the key 1/1 is tested on its ability to function (see FIG. 4G). Because of a "low" level on the control line 33, the sensitivity of the readout amplifier 32 is increased, so that a key signal on line 43 can be recognized in the non-depressed condition of the key 1/1, if the key 1/1 is unable to function.

Correspondingly, there follows after block 76 the interrogation pursuant to block 77 with the condition "key signal recognized". FIG. 4G shows the functional sequence if key 1/1 is malfunctioning and thus block 79 is called up. If, on the other hand, the condition "key signal recognized" is satisfied, the call up of block 78 ensues.

In this portion of the program according to block 78, keys 2 through 168 are checked for malfunction (see FIG. 4G). In case of malfunction, there ensues a malfunction message to central unit ZE just as was the case in block 79. Before block 72 can again be called up, the control line 33 must be set to a "high" level, meaning the readout amplifier 32 must be switched to nonsensitive.

It must still be mentioned in connection with block 79 that if key 1/1 is malfunctioning, there results the message "key 1/1 malfunctioning" to the central unit ZE.

The type of adjustment of the triggering point of the keys by means of the fundamental interlink signal can be performed only in four steps, if only two bits are available for the value of the blocking time duration. In actual practice, a triggering tolerance of 3 mm travel must be compensated with this. In addition, there is a tolerance based on erroneous adjustment of the keys because the adjustment of the keys is performed in the neutral position and not in the pressed-down position (2 mm). This leads to difficulties in the observation of excessively tight tolerances for the position of the triggering point. The type of adjustment at the triggering point by means of the fundamental interlink signal is shown to be a practicable solution by increasing the internal memory in the microcomputer or by making more bits for the value of the blocking time duration available.

The adjustment by means of a look-up table of values is best suited for an adjustment of the triggering point without any problems arising. It is also conceivable to store several different tables of values in order to thereby cover the displacement of the triggering points caused, for example, by a general change in the keyboard.

It is also possible by means of the arrangement in FIG. 5 to perform a functional test without key elements. In order to simplify the test of the keyboard printed circuit board 5, a resistance is added to the resistance R11 in FIG. 4A when performing the functional test. Thereby, the readout amplifier 32 becomes very sensitive and already the fundamental interlink signal 39 alone triggers at each functional coil 6/1, 6/2 a key message through the interface 31 (FIG. 5).

While the invention has been described in connection with preferred embodiments, it will be understood that modifications thereof within the principles outlined above will be evident to those skilled in the art and thus the invention is not limited to the preferred embodiments but is intended to encompass such modifications.

We claim:

1. In a circuit for an inductive keyboard wherein each key comprises a magnetic member which when moved into primary and secondary windings alters the coupling generating a coupling signal when a current pulse drives the primary winding and having means for adjusting the triggering level of the moved member while reducing mechanical and electric tolerances, the improvement comprising means under the control of a microcomputer for changing the steepness of the driving current pulse for presetting the triggering level for each keyboard key.

2. The circuit of claim 1, wherein the steepness changing means comprises a current switch having plural transistors, and means for selectively activating one or more of the transistors to change the steepness of the driving current pulse.

3. The circuit of claim 1, wherein the steepness changing means comprises a current switch and capacitance means and means for selectively controlling the charging time of the capacitance means in order to vary the voltage across the capacitance means, said capacitance means constituting the current source for the driving current pulse.

4. A circuit arrangement for adjusting the triggering point of keys in an inductive keyboard arranged in a matrix-like manner, each key having primary and secondary coils superimposed upon a printed circuit board and a magnetic member which when the key is depressed enters the coils producing a coupling signal, and means for reducing the effects of mechanically and electrically caused tolerances upon the adjustment of the key triggering point; said last-named reducing means comprising a microcomputer, a pulse generator for supplying a driving current pulse for the primary coil, a current switch connected to the pulse generator and the primary coil, said microcomputer being connected by control lines to the current switch, a readout amplifier connected to the secondary coil, and means for controlling the steepness of the driving current pulse to preset the triggering point of a key based on a specific amount of key travel when the key is depressed.

5. A circuit arrangement according to claim 4, wherein the key matrix comprises n rows of keys, the current switch comprises n current switches, one for each key row, and the driving current pulse is supplied to the primary coils of each key in a row under the control of the microcomputer.

6. A circuit arrangement according to claim 5, wherein the n current switches are constituted by an arrangement of n PNP-transistors.

7. A circuit arrangement according to claim 4, wherein the steepness controlling means comprises means under the control of the microcomputer for variably adjusting a blocking time duration for the current switches.

8. A circuit arrangement according to claim 7, wherein the pulse generator comprises a capacitance for each key row connected to a current switch such that said capacitance charges while the connected current switch is blocked, said capacitance discharging through the primary coils of a key row to form the driving current pulse therefor when the current switch is unblocked.

9. A circuit arrangement according to claim 8, wherein the microcomputer is connected to control the switching of the blocking time duration of the current switches as well as the unblocking of a current switch for the activation of a row of keys.

10. A circuit arrangement according to claim 5, wherein the pulse generator comprises means under the control of the microcomputer for a stepwise change of the steepness of the current pulse, said means including plural transistors and means for selectively activating the plural transistors in order to change the steepness of the current pulse in steps.

11. A circuit arrangement according to claim 5, wherein the pulse generator comprises means under the control of the microcomputer for a stepless change of the steepness of the current pulse, said means comprising a capacitance and a circuit for charging the capacitance, said capacitance being connected to discharge through the primary coils when the current switch is turned ON, the duration of the charging time for the capacitance being adjustable by the microcomputer.

12. A circuit arrangement according to claim 5, wherein the pulse generator comprises means for an automatic adjustment of the triggering point, said means including a resistance and a capacitance which is connected with the current switches in such a way that under microcomputer control the current switches are blocked in order to charge the capacitance through the resistance, and when the current switch is unblocked a current pulse flows through a primary coil winding until the capacitance is discharged.

13. A circuit arrangement according to claim 12, wherein the microcomputer is connected to change the blocking time value of the current switch for each individual key to change the steepness of the current pulse, and means for storing a blocking time value for each individual key.

14. A circuit arrangement according to claim 13, wherein the blocking time once it has been determined for each individual key is recorded as an unchangeable value in a table of values.

15. A circuit arrangement according to claim 13, wherein a blocking time value is provided for each individual key and which is recorded as a changeable value in a memory of the microcomputer.

16. A circuit arrangement according to claim 14, wherein the readout amplifier has a sensitivity which is controllable by the microcomputer in such a way that a key depression can be recognized in order to preset the trigger point of the key.

17. A circuit arrangement according to claim 14, wherein storage means is connected at the output of the readout amplifier in order to store an existing key signal until interrogated by the microcomputer.

18. In a circuit for an inductive keyboard wherein each key comprises a magnetic member which when moved into primary and secondary windings alters the coupling generating a coupling signal when a current pulse drives the primary winding and having means for adjusting the triggering level of the moved member while reducing mechanical and electric tolerances, the improvement comprising means under computer control for varying the steepness of the driving current pulse to vary the triggering level of a key, and means under computer control for storing a value representing a particular driving current pulse steepness to preset the triggering level for each keyboard key.

19. The circuit of claim 18, further comprising means for using the stored value during subsequent operations of the keyboard.

* * * * *